United States Patent [19]

Terashima

[11] Patent Number: 5,065,219

[45] Date of Patent: Nov. 12, 1991

[54] SEMICONDUCTOR DEVICE AND FABRICATION METHOD THEREOF

[75] Inventor: Tomohide Terashima, Fukuoka, Japan

[73] Assignee: Mitsubishi Denki Kabushiki Kaisha, Tokyo, Japan

[21] Appl. No.: 697,621

[22] Filed: May 9, 1991

[30] Foreign Application Priority Data

May 21, 1990 [JP] Japan .................. 2-132142

[51] Int. Cl.$^5$ .................. H01L 27/04; H01L 21/302
[52] U.S. Cl. .................. 357/50; 357/23.4; 357/23.6; 357/48; 357/49; 357/55; 437/63; 437/78; 437/913
[58] Field of Search .................. 357/23.4, 23.6, 48, 357/49, 50, 55; 437/63, 78, 913

[56] References Cited

U.S. PATENT DOCUMENTS 4,807,012 2/1989 Beasom .................. 357/50

FOREIGN PATENT DOCUMENTS 63-155775 6/1988 Japan .

Primary Examiner—Edward J. Wojciechowicz
Attorney, Agent, or Firm—Oblon, Spivak, McClelland, Maier & Neustadt

[57] ABSTRACT

An n$^+$-type diffusion region (19) is formed in a surface of an n$^-$-type semiconductor island (11) corresponding to a protrusion (23) by selective diffusion so that the bottom thereof is in contact with an n$^+$-type semiconductor layer (12) surrounding the island (11). A drain electrode (22) is formed on the diffusion region (19) to extract an operating current of a VDMOS transistor flowing through the n$^+$-type semiconductor layer (12). By virtue of the protrusion (23), the diffusion region (19) can reach the n$^+$-type semiconductor layer (12) by not so deep diffusion. Thus, lateral diffusion can be suppressed so that an area required for the diffusion region (19) may be smaller.

9 Claims, 6 Drawing Sheets

SEMICONDUCTOR DEVICE AND FABRICATION METHOD THEREOF

BACKGROUND OF THE INVENTION

1. Field of the Invention

The present invention relates to a high breakdown voltage semiconductor device formed in a dielectrically isolated island, as well as a fabrication method thereof.

2. Description of the Background Art

FIG. 7 is a sectional view schematically depicting a structure of this type of conventional semiconductor device. Referring to FIG. 7, an n$^-$-type semiconductor island 1 is surrounded by a low-resistance n$^+$-type semiconductor layer 2 and a dielectric layer 3. The n$^-$-type semiconductor island 1 is supported by a polysilicon substrate 4, while the n$^-$-type semiconductor island 1 and the n$^+$-type semiconductor layer 2 are insulated from the polysilicon substrate 4 by the dielectric layer 3.

Impurities are selectively diffused from the top surface of the n$^-$-type semiconductor island 1 to form p-type diffusion regions 5, while impurities are selectively diffused from the surface of each p-type diffusion region 5 to form n$^+$-type diffusion regions 6. A polysilicon gate electrode 8 covered with an insulation film 7 is provided onto each end of the p-type diffusion regions 5, thereby forming a VDMOS transistor comprising a plurality of DMOS cells.

Impurities are also diffused from a center of the top surface of the n$^-$-type semiconductor island 1 to form a deep n-type diffusion region 9 which extends from said surface and reaches the n$^+$-type semiconductor layer 2, while impurities are diffused from each end of the top surface of the n$^-$-type semiconductor island 1 to form shallow n$^+$-type diffusion regions 10 which connect with the n$^+$-type semiconductor layer 2. Source electrodes 11 and drain electrodes 12 of aluminum are provided on the insulation film 7. The source electrodes 11 are electrically connected with the p-type diffusion regions 5 and the n$^+$-type diffusion regions 6 through contact holes provided upon the insulation film 7, while the drain electrodes 12 are electrically connected with the deep n-type diffusion region 9 of the island center and the shallow n$^+$-type diffusion regions 10 of the island edges through contact holes provided upon the insulation film 7.

When a negative voltage is applied to the gate electrodes 8, the device is in an "off" state. Under the circumstances, if a high voltage is applied across the source electrodes 11 and the drain electrodes 12, a depletion layer grows from a p-n junction defined by the n$^-$-type semiconductor island 1 and the p-type diffusion regions 5, so that an almost entire region of the n$^-$-type semiconductor island 1 is depleted. Thus, high breakdown voltage characteristics of the device can be implemented. On the contrary, when a positive voltage is applied to the gate electrodes 8, portions of the p-type diffusion regions 5 beneath the gate electrodes 8 are inverted into n-type to form channels, through which electrons start flowing. The electrons reach the n$^+$-type semiconductor layer 2 via the n$^-$-type semiconductor island 1, and further reach the drain electrodes 12 via the n-type diffusion region 9 and the n$^+$-type diffusion regions 10, thereby turning the VDMOS transistor to an "on" state.

With a conventional semiconductor device comprising as the above, if the n$^-$-type semiconductor island 1 has a large surface area, current is extracted using the n-type diffusion region 9 located in the center of the island as well as the n$^+$-type diffusion regions 10 in the island edges in avoidance of an increased product of ON-resistance multiplied by area. When the n$^-$-type semiconductor island 1 is thick, the n-type diffusion region 9 in the island center must be deeply diffused. This unavoidablly results in increase of lateral diffusion, which causes a trouble of the n-type diffusion region 9 occupying an unnecessarily large surface area.

SUMMARY OF THE INVENTION

According to the present invention, a semiconductor device comprises a non-insulating support having a concave on one surface and a protrusion from a bottom of the concave, a dielectric layer formed on an entire surface of the concave insulating the protrusion, a low-resistance semiconductor layer of a predetermined conductivity type formed on the dielectric layer, a semiconductor island of the predetermined conductivity type formed on the low-resistance semiconductor layer and filling the concave, a low-resistance semiconductor region of the predetermined conductivity type formed in a surface of the semiconductor island corresponding to the protrusion and having a bottom being in contact with the low-resistance semiconductor layer located on an apex of the protrusion, a semiconductor element formed on the semiconductor island, and an electrode formed on the low-resistance semiconductor region for an operating current of the semiconductor element which flows through the low-resistance semiconductor layer.

According to the present invention, a fabrication method of a semiconductor device comprises preparing a semiconductor substrate of a predetermined conductivity type having first and second major surfaces, selectively and anisotropically etching the first major surface to form a relatively deeped first V-shaped groove surrounding a predetermined area of the first major surface and a relatively shallow second V-shaped groove within the predetermined area, forming a low-resistance semiconductor layer of the predetermined conductivity type on the first major surface of the semiconductor substrate including the first and the second V-shaped grooves, forming a dielectric layer on the low-resistance semiconductor layer, depositing a thick non-insulating material on the dielectric layer to form a support substrate having first and second protrusions corresponding to the first and the second grooves, removing the semiconducor substrate from the second major surface until the dielectric layer becomes exposed at the first protrusion to leave a semiconductor island of the predetermined conductivity type surrounded by the first protrusion, forming a low-resistance semiconductor region of the predetermined conductivity type in a surface of the semiconductor island corresponding to the second protrusion, which has a bottom being in contact with the low-resistance semiconductor layer located on an apex of the second protrusion, forming a semiconductor element on the semiconductor island, and forming an electrode on the low-resistance semiconductor region for an operating current of the semiconductor element which flows through the low-resistance semiconductor layer.

In accordance with the present invention, a protrusion protrudes from the support substrate into the bottom of the semiconductor island dielectrically isolated from the support substrate. In a portion corresponding to the protrusion of the top surface of the island, a low-resistance semiconductor region is formed to reach the low-resistance semiconductor layer. An electrodes is formed on the low-resistance semiconductor region, thereby extracting an operating current for the semiconductor element flowing through the low-resistance layer surrounding the island. By virtue of the protrusion, the low-resistance semiconductor region can be contact with the low-resistance semiconductor layer surrounding the island even when it is not so deeply formed. Consequently, if the low-resistance semiconductor regions is formed by diffusion from the surface of the island, lateral diffusion can be suppressed and, therefore, the low-resistance semiconductor region does not occupy unnecessarily large area upon the surface. Thus, a semiconductor device, as well as a fabricating method thereof, is obtained which requires a smaller area for accommodation of a structure to extract an operating current from the center of a dielectrically isolated island.

Accordingly, an object of the present invention is to provide a semiconductor device requiring smaller surface area in accommodation of a structure to extract an operating current from the center of a dielectrically isolated island as well as a fabrication method thereof.

These and other objects, features, aspects and advantages of the present invention will become more apparent from the following detailed description of the present invention when taken in conjunction with the accompanying drawings.

DETAILED DESCRIPTION OF THE PREFERRED EMBODIMENT

Figure 1:
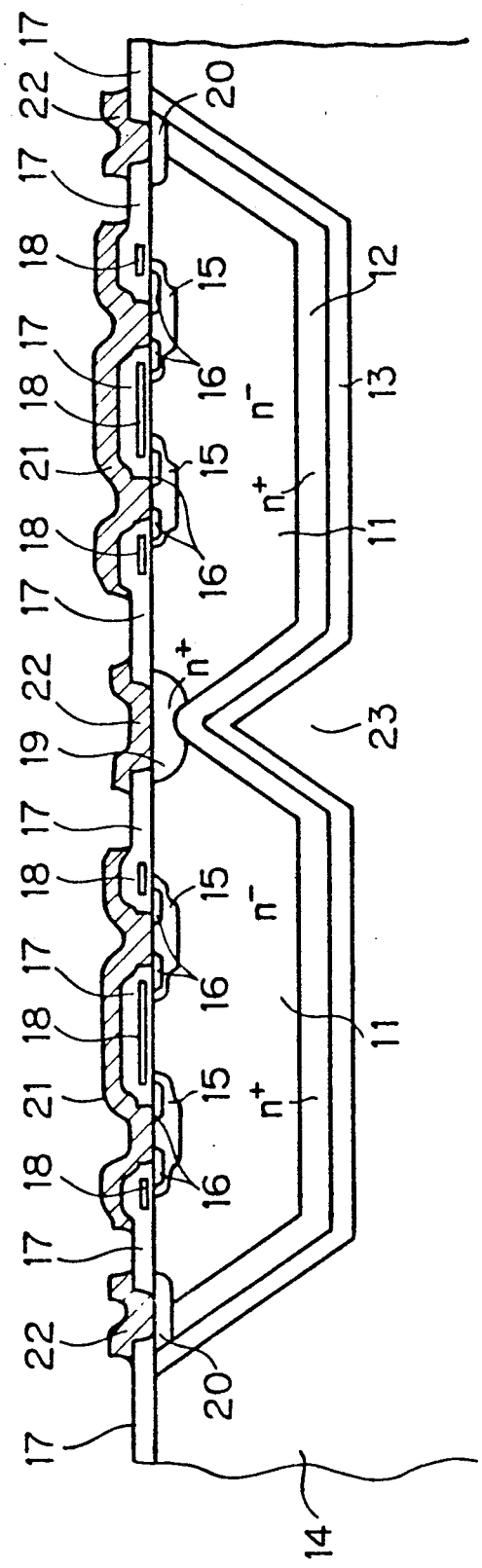
FIG. 1 is a schematic sectional view depicting the structure of an embodiment of the semiconductor device in accordance with the present invention.

FIG. 1 is a sectional view schematically depicting a structure of a semiconductor device in accordance with a preferred embodiment of the present invention. Referring to the figure, an $n^-$-type semiconductor island 11 formed of monocrystal silicon, for example, is surrounded by a low-resistance $n^+$-type semiconductor layer 12 and a dielectric layer 13. The $n^-$-type semiconductor island 11 is supporting by a polysilicon substrate 14, while the $n^-$-type semiconductor island 11 and the $n^+$-type semiconductor layer 12 are insulated from the polysilicon substrate 14 by the dielectric layer 13.

The polysilicon substrate 14 has a protrusion 23 in the center of the $n^-$-type semiconductor island 11 and, along the protrusion 23, the $n^+$-type semiconductor layer 12 and the dielectric layer 13 are elevated towards the top surface of the $n^-$-type semiconduct island 11.

Impurities are selectively diffused from the top surface of the $n^-$-type semiconductor island 11 to form p-type diffusion regions 15, while impurities are selectively diffused from the surface of each p-type diffusion region 15 to form $n^+$-type diffusion regions 16. A polysilicon gate electrode 18 covered with an insulation film 17 is provided on each end of the p-type diffusion regions 15, thereby forming a VDMOS transistor comprising a plurality of DMOS cells.

Figure 7:
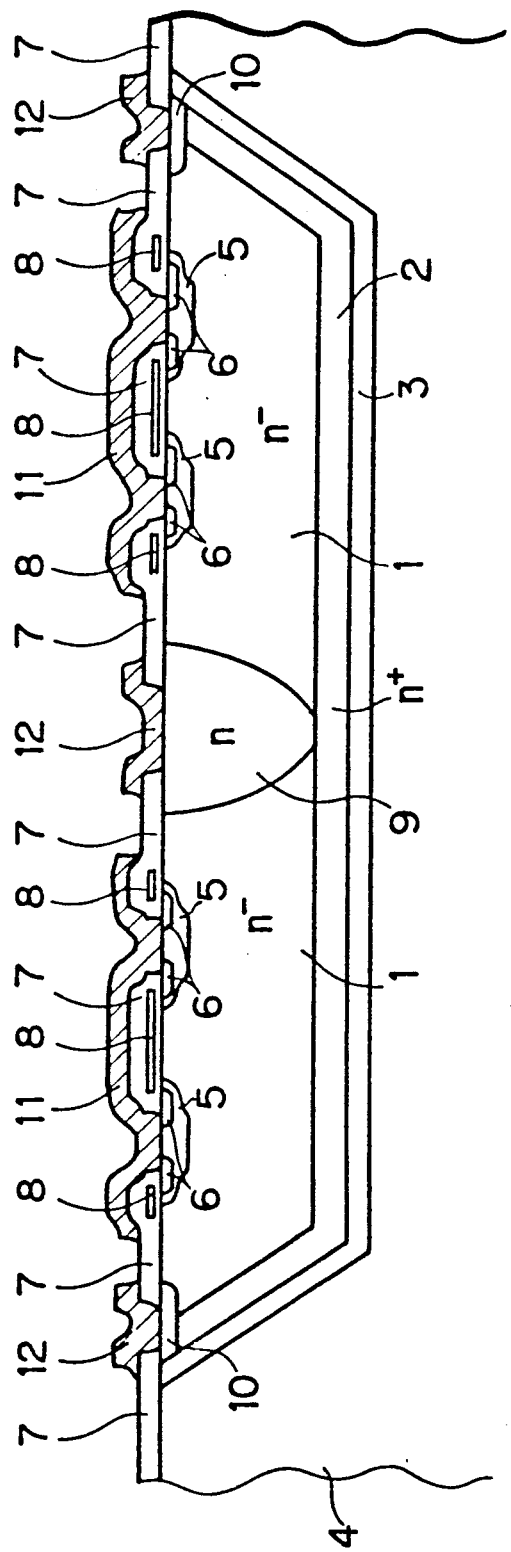
FIG. 7 is a schematic sectional view showing the structure of the conventional semiconductor device.

Impurities are also selectively diffused to form $n^+$-type diffusion regions 19 and 20 for electrode connection regions for extracting operating current of the VDMOS transistor flowing through the $n^+$-type low-resistance semiconductor layer 12. The $n^+$-type diffusion region 19 is diffused from the center of the front surface of the $n^-$-type semiconductor island 11 and reaches the $n^+$-type semiconductor layer 12. Since the $n^+$-type semiconductor layer 12 is elevated along the protrusion 23 from the polysilicon substrate 14, the depth of the region 19 can be shallower than the region 9 in FIG. 7. Consequently, lateral diffusion can be suppressed and, therefore, the region 19 does not occupy unnecessarily large area upon the surface. On the other hand, the $n^+$-type diffusion regions, 20 are formed on the $n^+$-type semiconductor layer 12 at ends of the $n^-$-type semiconductor island 11.

Source electrodes 21 and drain electrodes 22 of, e.g., aluminum are provided onto the insulation film 17. The source electrodes 21 are electrically connected with the p-type diffusion regions 15 and the $n^+$-type diffusion regions 16 through contact holes provided upon the insulation film 17, while the drain electrodes 22 are electrically connected with the $n^+$-type diffusion regions 19 and 20 through contact holes provided upon the insulation film 17.

When a negative voltage is applied to the gate electrodes 18, the VDMOS transistor is in an "off" state. Under the circumstances, if a high voltage is applied across the source electrodes 21 and the drain electrodes 22, a depletion layer grows from a p-n junction defined by the $n^-$-type semiconductor island 11 and the p-type diffusion regions 15, which results in depletion of an almost entire region of the $n^-$-type semiconductor island 11. Thereby achieved is high breakdown voltage characteristics of the device. On the contrary, when a positive voltage is applied to the gate electrodes 18, portions of the p-type diffusion regions 15 just under the gate electrodes 18 are inverted into n-type to form channels, thereby turning the VDMOS transistor to an "on" state. In the meanwhile, electrons injected from the $n^+$-type diffusion regions 16 into the $n^-$-type semiconductor island 11 through said channels flow towards the drain electrodes 11 via the low-resistance $n^+$-type semiconductor layer 12 and $n^+$-type semiconductor regions 19 and 20.

FIGS. 2A-2E are schematic sectional view depicting example process steps for fabrication of the semiconductor device shown in FIG. 1. The fabrication method will be described below with reference to these figures.

Figure 2A:
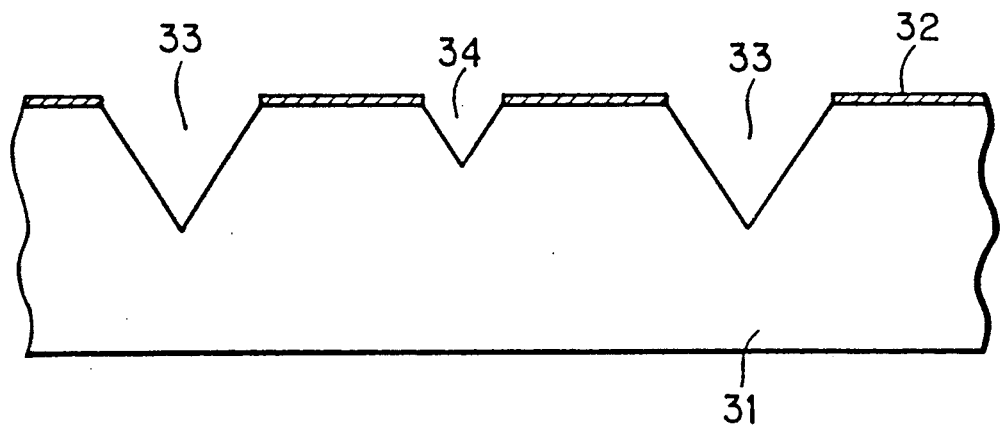
FIGS. 2A-2E are schematic sectional views depicting example process steps for fabrication of the semiconductor device shown in FIG. 1.
Figure 3:
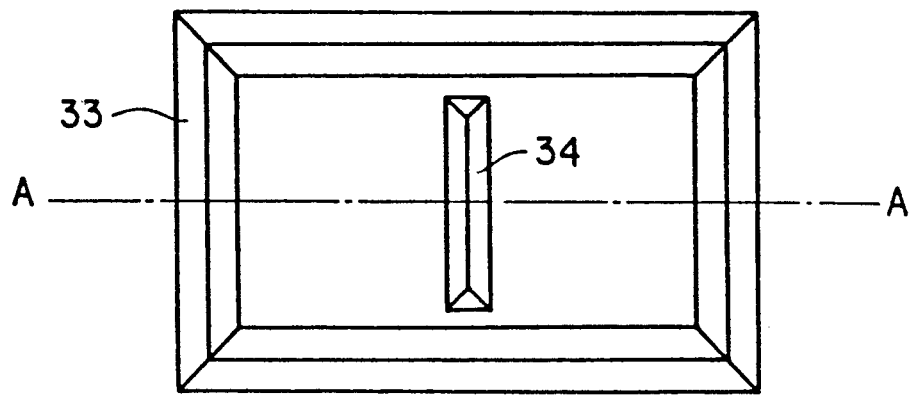
FIG. 3 is a schematic plane view depicting an example of a plane pattern V-shaped grooves.

As illustrated in FIG. 2A showing the first step, a mask pattern 32 of a SiN film is formed upon a single crystal silicon (100) substrate 31. By using the mask pattern 32 as an etching mask, anisotropic etching is carried out to the substrate 31, thereby forming a first and a second V-shaped grooves 33 and 34. Referring to a plane view shown in FIG. 3, the first V-shaped groove 33 surrounds the second V-shaped groove 34. FIG. 2A corresponds to a section along the line A—A drawn in FIG. 3. Since depths of both V-shaped grooves 33 and 34 are $1/\sqrt{2}$ times of widths of windows upon the mask pattern 32, the depth of the second V-shaped groove 34 can be made about one half of the depth of the first V-shaped groove, for example, by setting the width of the window for the second groove 34 about one half of the width of the window for the first groove 33.

Figure 2B:
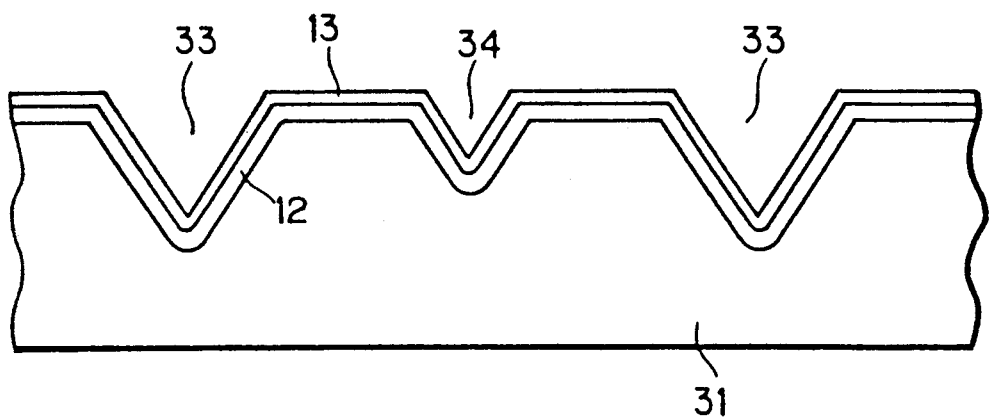

As illustrated in FIG. 2B showing the next step, an n+-type semiconductor layer 12 is formed upon the entire surface of the substrate 31 including the first and the second V-shaped grooves 33 and 34 by removing the mask pattern 32 and diffusing n-type impurities to the entire surface. Then, through thermal oxidation of the entire surface, a dielectric layer 13 of an oxide film is formed on the n+-type semiconductor layer 12.

Figure 2C:
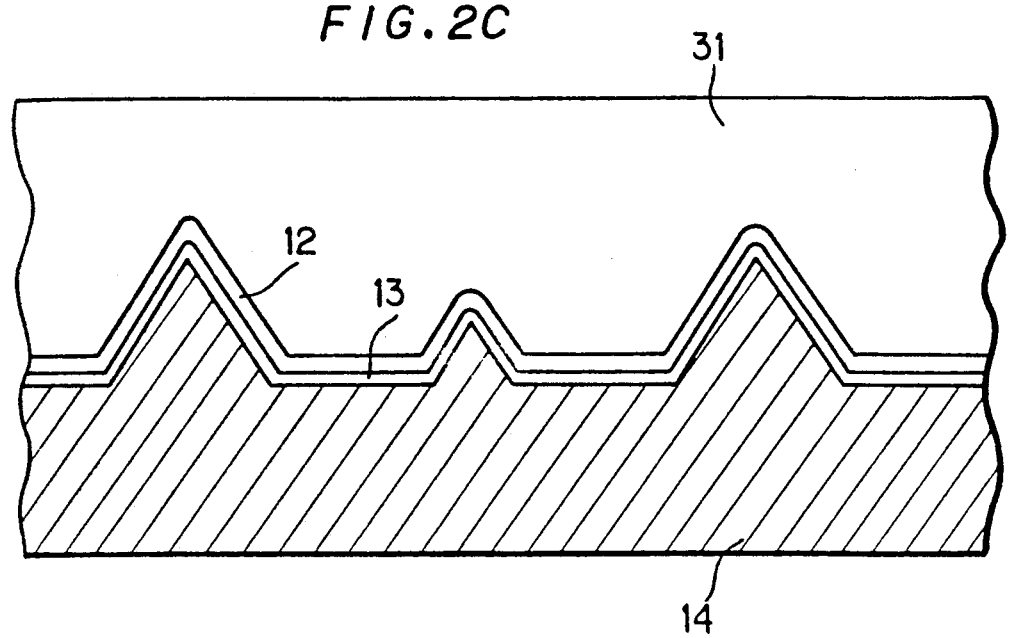

As illustrated in FIG. 2C, a polysilicon substrate 14 serving as a support substrate is formed by forming a thick deposit of polysilicon upon the entire surface of the dielectric layer 13 and flattering the surface of the polysilicon. It should be noted that FIGS. 2C to 2E are upside-down illustrated.

Figure 2D:
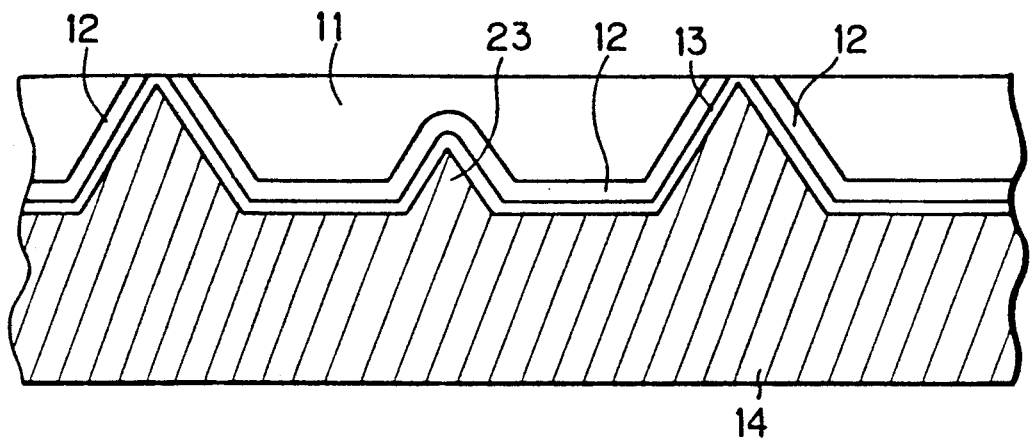

As illustrated in FIG. 2D, the n−-type single crystal silicon substate 31 is polished from a rear surface side (from an upper surface side in FIG. 2D) until dielectric layer 13 is exposed at the apex of the first V-shaped groove 33. Thereby formed is an n−-type semiconductor island 11 of single crystal silicon. A protrusion 23 corresponding to the shallow second V-shaped groove 34 protrudes from the polysilicon substrate 14 at the center of the bottom of the n−-type semiconductor island 11. The n+-type semiconductor layer 12 and the dielectric layer 13 are elevated towards the front surface of the n−-type semiconductor island 11 along the protrusion 23.

Figure 2E:
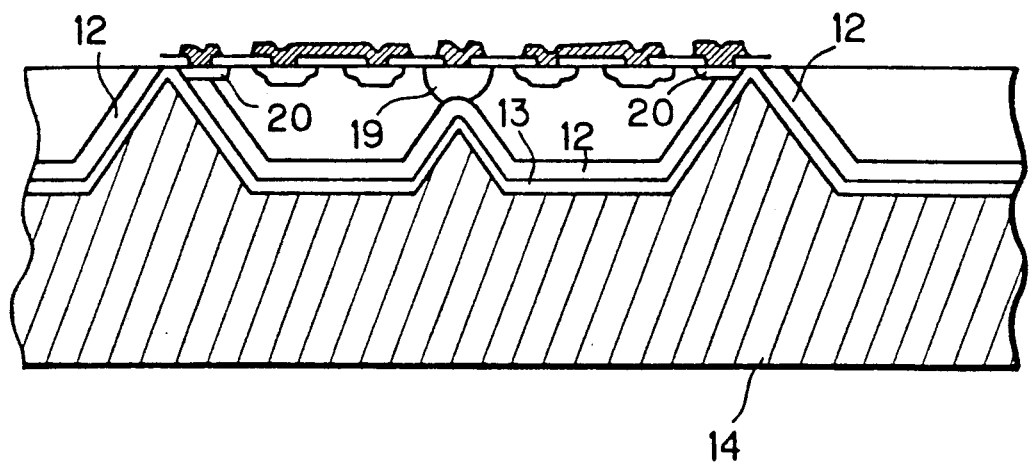

As illustrated in FIG. 2E, impurities are selectively diffused from the front surface to form n+-type diffusion regions 19 and 20 which are in contact with the n+-type semiconductor layer 12. Since the depth of the n+-type diffusion region 10 may be shallow, lateral diffusion can be suppressed and, therefore, the region 19 has only to occupy minimum required area upon the surface. Hereafter, a structure similar to FIG. 1 is implemented by forming DMOS structures and interconnections using well known method. It should be noted that the n+-type regions 16 and the gate electrodes 18 are not shown in FIG. 2E.

Figure 4A:
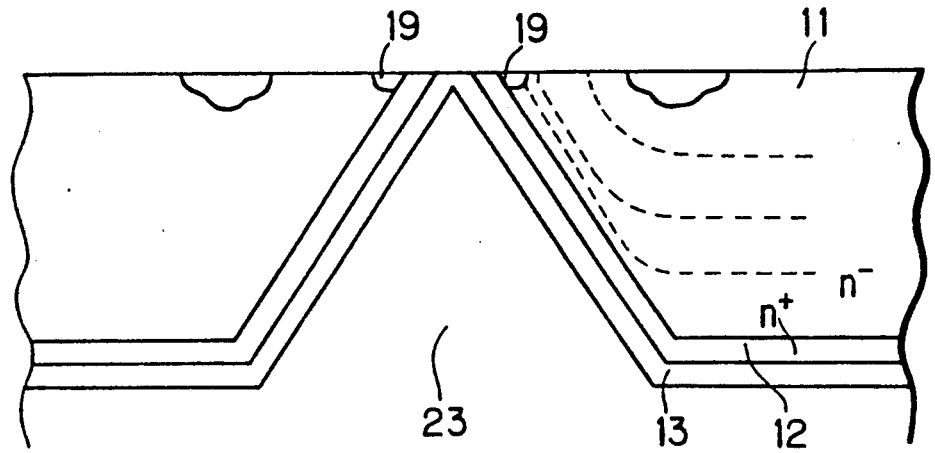
FIGS. 4A-4C are schematic sectional views depicting semiconductor devices having V-shaped grooves of different depths.
Figure 4B:
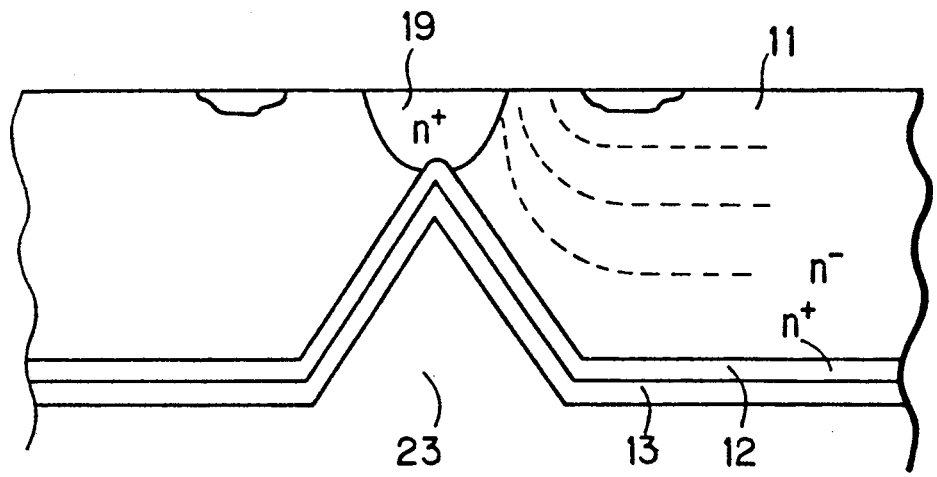
Figure 4C:
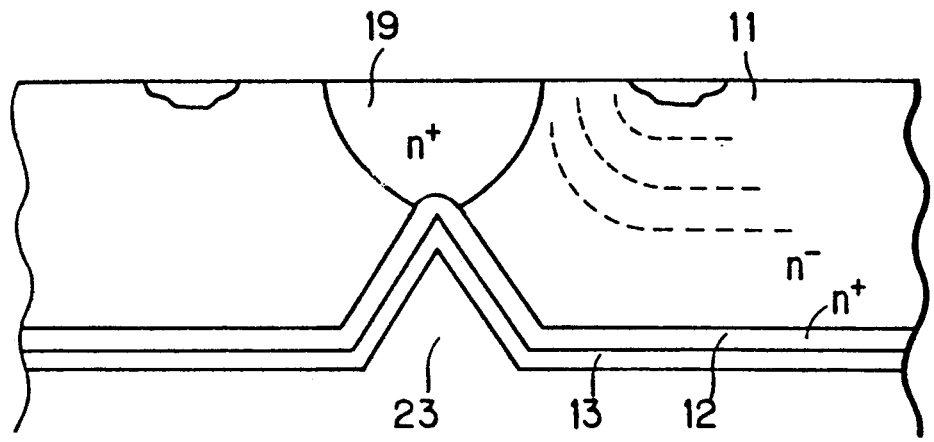

FIGS. 4A-4C respectively illustrate cases wherein the second V-shaped groove 34 is formed with an excessively deep depth, with an appropriate depth, and with an excessively shallow depth. Corresponding to the depths of the second V-shaped groove 34, the height of the protrusion 23 from the polysilicon substrate 14 is excessively high in FIG. 4A, appropriate in FIG. 4B, and excessively short in FIG. 4C. Referring to FIG. 4A, growth of a depletion layer from a DMOS cell shown in broken lines is suppressed by the protrusion 23 and, therefore, a large distance must be secured between the protrusion 23 and the DMOS cell in achievement of high breakdown voltage characteristics. On the contrary, referring to FIG. 4C, lateral growth of the depletion layer from the DMOS cell is suppressed by the n+-type diffusion region 19 and, therefore, a large distance must be secured between the n+-type diffusin region 19 and the DMOS cell in achievement of high breakdown voltage characteristics. Consequently, referring to FIG. 4B, there must be an optimum depth of the second V-shaped groove 34, i.e., an optimum height of the protrusion 23 in terms of area efficiency.

Figure 5:
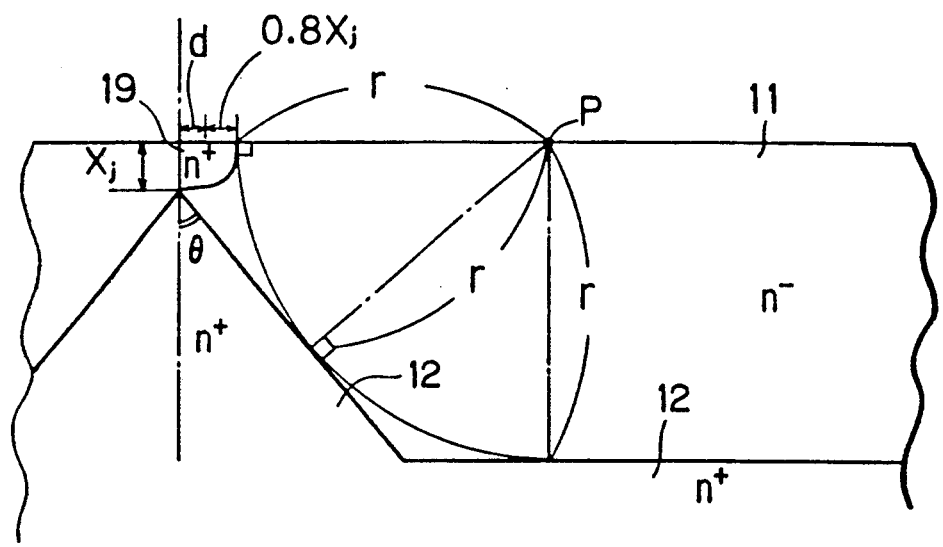
FIG. 5 is a simplified sectional view depicting the structure of the V-shaped groove.

A structure illustrated in FIG. 5 is assumed in search for the optimum depth of the second V-shaped groove 34 with respect to the depth of the n−-type semiconductor island 11. Specifically, it is assumed that the DMOS cell is located on point P, and that the depletion layer extending therefrom is in contact with the n+-type semiconductor layer 12 under the bottom of the n−-type semiconductor island 11, the n+-type semiconductor layer 12 upon the side wall of the second V-shaped groove and the n+-type diffusion region 19 at an equal distance r. Then, relations between the dimensions specified in the figure are defined by the following equations:

$$\cos\theta \cdot (d + 0.8x_j + r + x_j\tan\theta) = r \quad (1)$$

$$\therefore x_j = \frac{(1 - \cos\theta)r - d\cos\theta}{0.8\cos\theta + \sin\theta} \quad (2)$$

where d is a width from a center line of a window of a mask used to form the n+-type diffusion region 19, $x_j$ is a diffusion depth of the n+-type diffusion region 19, 0.8 $x_j$ is a lateral diffusion length of the n+-type diffusion region 19, and $\theta$ is an opening angular with respect to the center line of the second V-shaped groove.

In the case of anisotropic etching, $\cos\theta$ equals to $\sqrt{2}/\sqrt{3}$ and $\sin\theta$ equals to $1/\sqrt{3}$. By substituting these values for the corresponding symbols in equation (2), the following equation is obtained.

$$x_j = \frac{5(\sqrt{3} - \sqrt{2})}{4\sqrt{2} + 5}r - \frac{5\sqrt{2}}{4\sqrt{2} + 5}d \quad (3)$$

Dimensions of a structure are assumed as specified in FIG. 5 with respect to an actual n−-type semiconductor island 11. Referring to the figure, a broken line shows a position of a surface of the substate 31 just after formation of the first and the second V-shaped grooves 33 and 34. Also in the figure, $x_1$ is a thickness of the dielectric layer 13 extending into the substrate 31 side in the thermal oxidation process, $x_2$ is a thickness of the n+-type semiconductor layer 12, $x_3$ is a distance between the top surface of n−-type semiconductor island 11 and the n+-type semiconductor layer 12 measured at the apex of the second V-shaped groove, A is a width of the window of the mask used to form the first V-shaped groove 33, and B is a width of the window of the mask used to form the second V-shaped groove 34. It is also assumed that polishing of the substrate 31 is stopped when the apex of the broken line corresponding to the apex of the first V-shaped groove 33 coincides with the surface.

Figure 6:
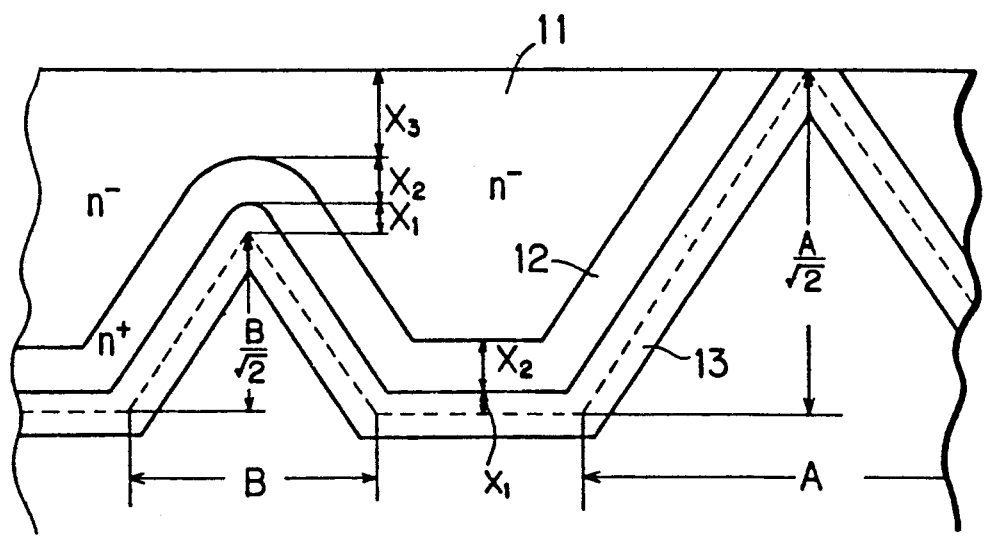
FIG. 6 is a schematic sectional view depicting dimensions of the structure of the V-shaped groove.

Referring to FIGS. 5 and 6 in conjunction with each other, the following equation is obtained by applying dimension symbols in FIG. 6 to the equation (3):

$$\frac{A}{\sqrt{2}} - \frac{B}{\sqrt{2}} - x_1 - x_2 = \frac{5(\sqrt{3} - \sqrt{2})}{4\sqrt{2} + 5} \cdot \quad (4)$$

$$\left(\frac{A}{\sqrt{2}} - x_1 - x_2\right) - \frac{5\sqrt{2}}{4\sqrt{2} + 5}d$$

Hence, $$B = \frac{9\sqrt{2} - 5\sqrt{3} + 5}{4\sqrt{2} + 5} \cdot (A - \sqrt{2} \cdot x_1 - \sqrt{2} \cdot x_2) +$$

$$\frac{10}{4\sqrt{2} + 5} d$$

$$= \frac{9\sqrt{2} - 5\sqrt{3} + 5}{4\sqrt{2} + 5} \cdot A - \frac{9\sqrt{2} - 5\sqrt{3} + 5}{4\sqrt{2} + 5} \cdot$$

$$\sqrt{2}(x_1 + x_2) + \frac{10}{4\sqrt{2} + 5} d$$

$$\approx 0.85A - 1.2(x_1 + x_2) + 0.94d$$

Since $x_1$, $x_2$ and d are much smaller than A, and since the second and the third terms $-1.2(x_1+x_2)$ and 0.94 d approximately offset against each other, these terms are negligible and the following is obtained:

$$B \approx 0.85A \tag{6}$$

Thus, it can be concluded that the width B of the window of the mask used to form the second V-shaped groove 34 is optimum to be approximately 0.85 times of the width A of the window of the mask used to form the first V-shaped groove 33. In other words, to optimum depth of the second V-shaped groove 34 is approximately 0.85 times of the depth of the first V-shaped groove 33 (or the optimum height of the protrusion 23 is about 0.85 times of the depth of the n⁻-type type semiconductor island 11) in achievement of high breakdown voltage characteristics and good area efficiency.

In the abovementioned embodiment, a VDMOS transistor is formed upon the n⁻-type semiconductor island 11. However, it should be clearly understood that other elements than VDMOS transistor may be formed.

It is also clearly understood that a monocrystal silicon substrate, etc. may be used in place of the polysilicon substrate 14 as a support substrate.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
    a non-insulating support having a concave on one surface and a protrusion from a bottom of said concave;
    a dielectric layer formed on an entire surface of said concave insulating said protrusion;
    a low-resistance semiconductor layer of a predetermined conductivity type formed on said dielectric layer;
    a semiconductor island of said predetermined conductivity type formed on said low-resistance semiconductor layer and filling said concave;
    a low-resistance semiconductor region of said predetermined conductivity type formed in a surface of said semiconductor island corresponding to said protrusion and having a bottom being in contact with said low-resistance semiconductor layer located on an apex of said protrusion;
    a semiconductor element formed on said semiconductor island; and
    an electrode formed on said low-resistance semiconductor region for an operating current of said semiconductor element which flows through said low-resistance semiconductor layer.

2. A semiconductor device in accordance with claim 1, wherein
    a height of said protrusion is approximately 0.85 times of a depth of said semiconductor island.

3. A semiconductor device in accordance with claim 1, wherein
    said support substrate includes a polysilicon substrate.

4. A semiconductor device in accordance with claim 1, wherein
    said semiconductor element includes a VDMOS transistor.

5. A method of fabricating a semiconductor device, comprising the steps of:
    preparing a semiconductor substrate of a predetermined conductivity type having first and second major surfaces;
    selectively and anisotropically etching said first major surface to form a relatively deep first V-shaped groove surrounding a predetermined area of said first major surface and a relatively shallow second V-shaped groove within said predetermined area;
    forming a low-resistance semiconductor layer of said predetermined conductivity type on said first major surface of said semiconductor substrate including said first and second V-shaped grooves;
    forming a dielectric layer on said low-resistance semiconductor layer;
    depositing a thick non-insulating material on said dielectric layer to form a support substrate having first and second protrusions corresponding to said first and second grooves;
    removing said semiconductor substrate from said second major surface until said dielectric layer becomes exposed at said first protrusion to leave a semiconductor island of said predetermined conductivity type surrounded by said first protrusion;
    forming a low-resistance semiconductor region of said predetermined conductivity type in a surface of said semiconductor island corresponding to said second protrusion, which has a bottom being in contact with said low-resistance semiconductor layer located on an apex of said second protrusion;
    forming a semiconductor element on said semiconductor island, and
    forming an electrode on said low-resistance semiconductor region for an operating current of said semiconductor element which flows through said low-resistance semiconductor layer.

6. A method of fabricating a semiconductor device in accordance with claim 5, wherein
    a depth of said second V-shaped groove is approximately 0.85 times of a depth of said first V-shaped groove.

7. A method of fabricating a semiconductor device in accordance with claim 5, wherein
    said step of forming a low-resistance semiconductor region includes the step of selectively diffusing impurities of said predetermined conductivity type from the surface of said semiconductor island.

8. A method of fabricating a semiconductor device in accordance with claim 5, wherein
    said support substrate includes a polysilicon substrate.

9. A method of fabricating a semiconductor device in accordance with claim 5, wherein
    said semiconductor element includes a VDMOS transistor.

* * * * *